United States Patent [19]
Itoh et al.

[11] Patent Number: 5,987,563
[45] Date of Patent: *Nov. 16, 1999

[54] FLASH MEMORY ACCESSED USING ONLY THE LOGICAL ADDRESS

[75] Inventors: Hiroyuki Itoh; Noriyuki Matsui, both of Kawasaki, Japan

[73] Assignee: Fujitsu Limited, Kawasaki, Japan

[*] Notice: This patent is subject to a terminal disclaimer.

[21] Appl. No.: 09/208,474

[22] Filed: Dec. 10, 1998

Related U.S. Application Data

[62] Division of application No. 08/998,073, Dec. 24, 1997, which is a continuation of application No. 08/018,794, Feb. 16, 1993, abandoned.

[30] Foreign Application Priority Data

Feb. 20, 1992 [JP] Japan .................................... 4-033398

[51] Int. Cl.⁶ .................................................. G06F 12/02
[52] U.S. Cl. .............................. 711/103; 711/1; 711/203; 711/156
[58] Field of Search .............................. 711/1, 103, 156, 711/203; 714/48

[56] References Cited

U.S. PATENT DOCUMENTS

| | | | |
|---|---|---|---|
| 3,685,020 | 8/1972 | Meade ..................................... | 711/117 |
| 4,758,982 | 7/1988 | Price ..................................... | 711/108 |
| 4,780,815 | 10/1988 | Shiota ..................................... | 711/171 |
| 5,072,422 | 12/1991 | Rachels ..................................... | 365/49 |
| 5,172,338 | 12/1992 | Mehrotra et al. ................... | 365/185.03 |
| 5,297,148 | 3/1994 | Harari et al. ....................... | 365/185.09 |
| 5,303,198 | 4/1994 | Adachi et al. ....................... | 365/185.11 |
| 5,341,330 | 8/1994 | Wells et al. ......................... | 365/185.33 |
| 5,353,256 | 10/1994 | Fandrich et al. .................... | 365/185.11 |
| 5,437,020 | 7/1995 | Wells et al. ............................ | 711/100 |
| 5,463,751 | 10/1995 | Yonezawa et al. ......................... | 711/1 |
| 5,479,633 | 12/1995 | Wells et al. .............................. | 711/103 |
| 5,479,638 | 12/1995 | Assar et al. ............................. | 711/103 |
| 5,485,595 | 1/1996 | Assar et al. ............................. | 711/103 |
| 5,630,093 | 5/1997 | Holzhammer et al. .................. | 711/115 |

FOREIGN PATENT DOCUMENTS

| | | |
|---|---|---|
| 0 392 895 A3 | 10/1990 | European Pat. Off. . |
| 0 522 780 A2 | 1/1993 | European Pat. Off. . |
| 0 544 252 A2 | 6/1993 | European Pat. Off. . |
| 1-298600 | 12/1989 | Japan . |

OTHER PUBLICATIONS

Preliminary Search Report for corresponding French application, dated Nov. 25, 1994.

*Primary Examiner*—Reginald G. Bragdon
*Attorney, Agent, or Firm*—Armstrong, Westerman, Hattori, McLeland & Naughton

[57] ABSTRACT

A flash memory control apparatus and method which enables updating of data at high speed. The flash memory control apparatus includes a flash memory having a memory region which is divided into a plurality of sectors each including a logical address portion for storing a logical address of the sector, an erasure managing portion for storing information which indicates at least whether or not the sector may be erased, and a data part for storing data; and a control device, coupled to the flash memory, for making access to an arbitrary sector of the flash memory by specifying the logical address of the arbitrary sector. The flash memory control method includes the steps of: (a) dividing a memory region of a flash memory into a plurality of sector; and (b) making access to an arbitrary sector of the flash memory by specifying the logical address of the arbitrary sector. Each of the sectors includes a logical address portion for storing a logical address of the sector, an erasure managing portion for storing information which indicates at least whether or not the sector may be erased, and a data part for storing data.

21 Claims, 5 Drawing Sheets

FIG. 3
(A)
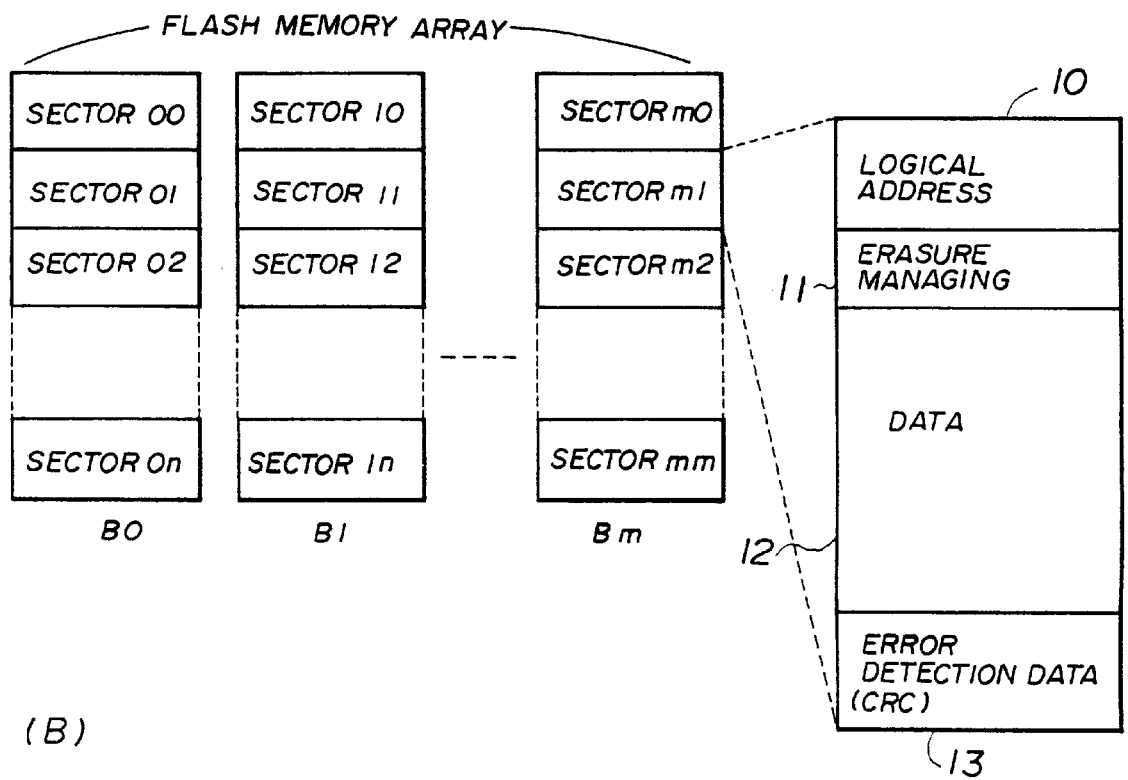
(B)
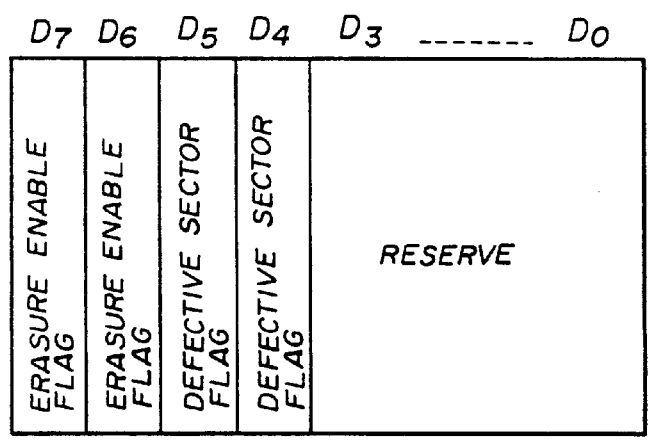

FLASH MEMORY ACCESSED USING ONLY THE LOGICAL ADDRESS

This application is a Division of prior application Ser. No. 08/998,073 filed Dec. 24, 1997; which is a Continuation application of Ser. No. 08/018,794 filed Feb. 16, 1993 abandoned.

BACKGROUND OF THE INVENTION

The present invention generally relates to flash memory control methods and apparatuses. More particularly the present invention related to a flash memory control method which enables updating of data at a high speed and to a flash memory control apparatus which employs such a flash memory control method.

Data processing apparatuses use disks such as magnetic disks and floppy disks as files. However, such disks are relatively heavy due to their mechanical structure, and also have a relatively large power consumption.

Accordingly, it is conceivable to use volatile semiconductor memories such as a dynamic random access memory (DRAM) and a static RAM (SRAM) as mass storage units in place of the disks. However, the volatile semiconductor memories require a backup power source such as a lithium battery, and the DRAM and the SRAM are no exception. Hence, it is conceivable to use a flash memory which has been recently developed as the mass storage unit. The flash memory requires no backup power source and is inexpensive compared to the DRAM and SRAM.

The inexpensive flash memory is a non-volatile memory and is also electrically rewritable. However, the following problems exist in the flash memory.

First, the data cannot be written unless the prestored data is once erased. However, the data erasure cannot be made one byte at a time, for example. The data erasure must be made in blocks or the data erasure must be made with respect to the entire flash memory chip. The block is a relatively large unit, and amounts to several tens of kbytes to several hundreds of kbytes.

Second, it is impossible to rewrite the data to an arbitrary address in a physical address space, because the data erasure must be made in blocks as described above. Hence, when rewriting the data, it is necessary to temporarily save the data in blocks at a certain location before making the data erasure in blocks. Then, the data which is not to be erased is written from the saved location, and the data to be newly written is thereafter written.

Third, because the rewriting of the data requires the troublesome process of temporarily saving the data and making the data erasure in blocks as described above, the write speed or the erasure speed is considerably slow compared to the read speed. In addition, because the data erasure is made in blocks which are relatively large, the rewriting of data takes an extremely long time to complete. As a result, in the case of a database which treats a large amount of data, the rewriting of data is virtually impossible.

Therefore, the flash memory has a big problem in that the rewriting of data cannot be made by an access means which uses an address similarly to the DRAM, the SRAM or the hard disk. For this reason, it is virtually impossible to use the flash memory in place of the DRAM, SRAM, the hard disk or the like. However, because the flash memory requires no backup power source and is inexpensive, there are demands to put the advantageous features of the flash memory in use.

SUMMARY OF THE INVENTION

Accordingly, it is a general object of the present invention to provide novel and useful flash memory control method and apparatus in which the problems described above are eliminated.

Another and more specific object of the present invention is to provide a flash memory control method comprising the steps of (a) dividing a memory region of a flash memory into a plurality of sectors, where each of the sectors include a logical address part for storing a logical address of the sector, an erasure managing part for storing information which indicates at least whether or not the sector may be erased, and a data part for storing data, and (b) making access to an arbitrary sector of the flash memory by specifying the logical address of the arbitrary sector. According to the flash memory control method of the present invention, it is possible to use the inexpensive flash memory as a file or a mass storage unit because the data is rewritable with ease at a high speed by managing the memory region of the flash memory in sectors.

Still another object of the present invention is to provide a flash memory control apparatus comprising a flash memory having a memory region which is divided into a plurality of sectors each including a logical address part for storing a logical address of the sector, an erasure managing part for storing information which indicates at least whether or not the sector may be erased, and a data part for storing data, and control means, coupled to the flash memory, for making access to an arbitrary sector of the flash memory by specifying the logical address of the arbitrary sector. According to the flash memory control apparatus of the present invention, it is possible to use the inexpensive flash memory as a file or a mass storage unit because the data is rewritable with ease at a high speed by managing the memory region of the flash memory in sectors.

Other objects and further features of the present invention will be apparent from the following detailed description when read in conjunction with the accompanying drawings.

BRIEF DESCRIPTION OF THE DRAWINGS

FIG. 3 is a diagram for explaining the state of use of a flash memory of the embodiment shown in FIG. 2;

DESCRIPTION OF THE PREFERRED EMBODIMENTS

Figure 1:
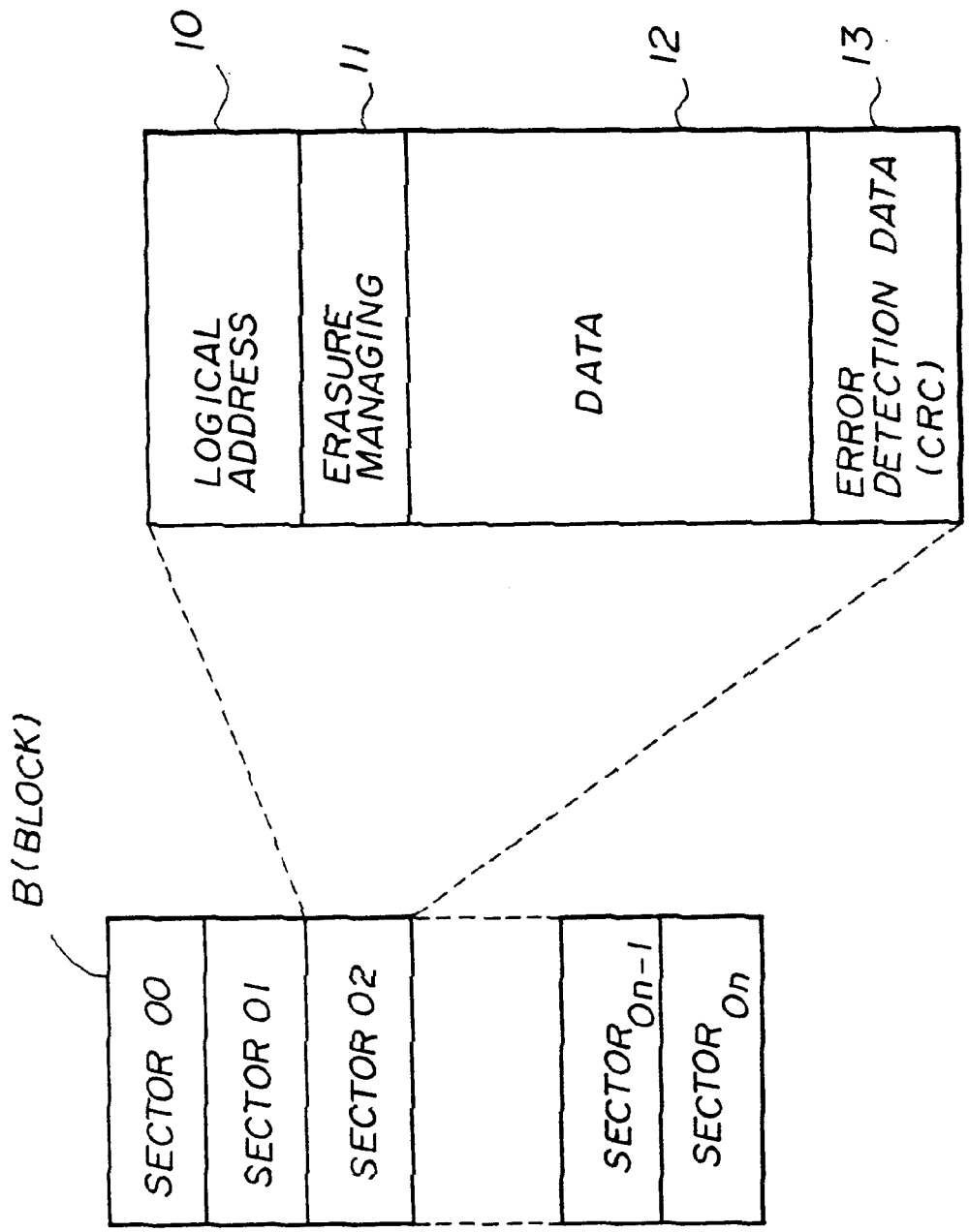
FIG. 1 is a diagram for explaining the operating principle of the present invention.

First, a description will be given of the operating principle of the present invention, by referring to FIG. 1.

In the present invention, a flash memory is managed in sectors 00 through 0n. Each sector has the same structure, but FIG. 1 shows the structure of the sector 02 as an example. As shown, the sector 02 includes a logical address part 10, an erasure managing part 11, a data part 12, and an error detection data part 13.

A sector address, which is a logical address, is assigned to each sector so that the data access is made using the sector address and not a physical address. If a write instruction is issued, erasure managing bits in the erasure managing part 11 of the concerned sector are set so as to indicate that the data part 12 of this sector has become invalid. In addition, the data which is to be newly written is written into the empty sector of the flash memory, and the logic address of this sector is set to a logic address which is the same as that of the sector which was invalidated by the setting of the erasure managing bits.

A region of the flash memory in which the data is already written cannot be rewritten into a different data by specifying the address. However, the data can be written into an empty region in which no data has been written, that is, a region which is in an initial state, by specifying the address. The present invention uses this characteristic of the flash memory so as to obtain effects which are similar to those obtained if the data were substantially rewritten in sectors. In other words, the effects obtained by the present invention are as if the rewriting of data were made in sectors.

When the data is written into each sector, the erasure managing part 11 thereof is reset to the initial state. Then, a logical address is written into the logical address part 10 of the sector, and the data which is to be written into this logical address is written into the data part 12 of the sector. In addition, an error detection data such as a cyclic redundancy check (CRC) code is written into the error detection data part 13 of the sector. For example, the error detection data enables correction of the error in 1 bit and the detection of the error in 2 bits.

If the data of the sector 02 is to be rewritten in FIG. 1 and empty sectors start from the sector 0n−1, the erasure managing bits in the erasure managing part 11 of the sector 02 are set by writing data complementary to that at the time of the initial state. Next, a logical address which is the same as the logical address of the sector 02 is written into the logical address part 10 of the sector 0n−1, and the new data is written into the data part 12 of the sector 0n−1. In addition, the appropriate data for error detection and correction is written into the error detection data part 13 of the sector 0n−1. In this case, the erasure managing part 11 of the sector 02, the logical address part 10 of the sector 0n−1 and the data part 12 of the sector 0n−1 are all in the initial state before the writing takes place, and thus, the write operation is limited to the regions in the initial state and can be carried out at high speed.

When actually reading out the data from the logical address region, the logical address parts 10 of each of the sectors are successively scanned. First, the access destination is detected from the logical address part 10 of the sector 02. However, since the erasure managing bits in the erasure managing part 11 of the sector 02 are set, it is recognized that the sector 02 has been erased, and the scan of the logical address parts 10 of the remaining sectors continues. The logical address of the access destination is detected from the logical address part 10 of the sector 0n−1, and the necessary data is obtained from the data part 12 of this sector 0n−1.

Therefore, the rewriting of data can be carried out at high speed using the flash memory, without the need to actually erase the flash memory and thereafter write the new data.

Figure 2:
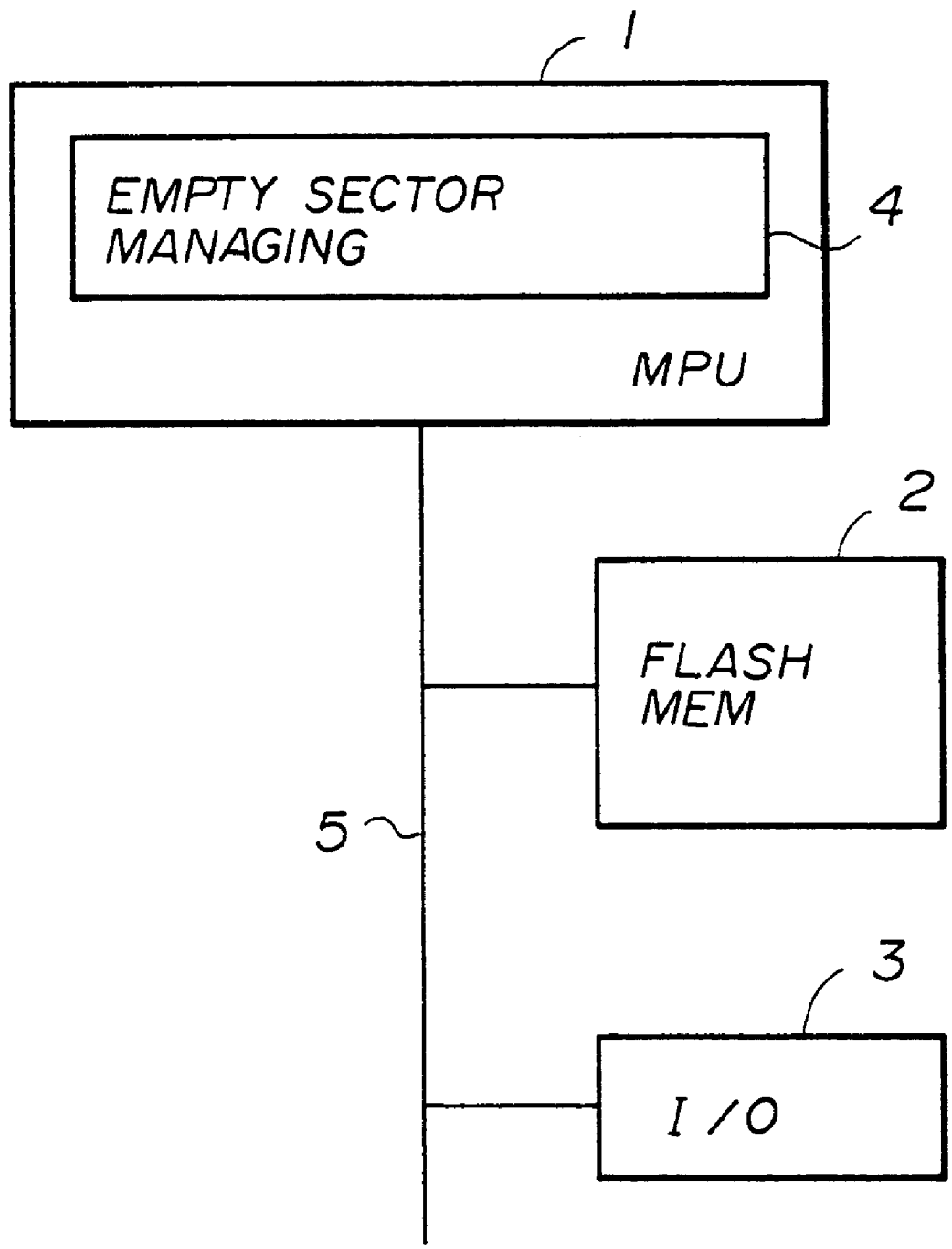
FIG. 2 is a system block diagram showing an embodiment of a flash memory control apparatus according to the present invention.

Next, a description will be given of an embodiment of a flash memory control apparatus according to the present invention, by referring to FIGS. 2 and 3. FIG. 2 shows an essential part of this embodiment, and FIG. 3 is a diagram for explaining the state of use of a flash memory in this embodiment. This embodiment of the apparatus employs an embodiment of a flash memory control method according to the present invention, as will be described hereunder and particularly with reference to FIGS. 4 and 5 which will be described later.

In FIG. 2, the flash memory control apparatus generally includes a microprocessor (MPU) 1, a flash memory 2, and an input/output unit 3 which are coupled via a bus 5. The MPU 1 controls the access with respect to the flash memory 2, and includes an empty sector managing part 4 which manages empty sectors of the flash memory 2. The flash memory 2 has a structure shown in FIG. 3, for example. The input/output unit 3 inputs the data which is to be stored in the flash memory 2 and outputs the necessary data which is read out from the flash memory 2.

As shown in FIG. 3 (A), the flash memory 2 is made up of blocks B0 through Bm. The block B0 is made up of sectors 00 through 0n, the block B1 is made up of sectors 10 through 1n, . . . , and the block Bm is made up of sectors m0 through mn.

Each block corresponds to the minimum unit with which the erasure can be made, that is, the erasure can be made block-wise. Each block may correspond to one flash memory chip or a part of the flash memory chip. Hence, the blocks B0 through Bm shown in FIG. 3 (A) may correspond to one or a plurality of flash memory chips, and the flash memory 2 shown in FIG. 2 may be made up of one or a plurality of flash memory chips.

The sectors forming each block respectively have an arbitrary size which is selected appropriately. As described above with reference to FIG. 1, each sector includes the logical address tart 10, the erasure managing part 11, the data part 12, and the error detection data part 13. When cre flash memory 2 it usea as a file, for example, the data which is to be stored in the file is written into the data part 12 of the sector.

As shown in FIG. 3 (B), an erasure enable flag which indicates that the concerned sector has been erased and is invalid is written into bits D7 and D6 of the erasure managing part 11 of this concerned sector. In addition, a defective sector flag which indicates that the concerned sector is defective is written into bits D5 and D4 of the erasure managing part 11 of this concerned sector. In this embodiment, the erasure enable flag and the defective sector flag are written in dual data sets in order to improve the reliability of the flash memory control apparatus, however, it is of course possible to provide more than two erasure enable flags and more than two defective sector flags. Remaining bits D3 through D0 of the erasure managing part 11 are reserve bits.

In FIG. 3, if the data are written up to the sector m0, the empty sector managing part 4 of the MPU 1 shown in FIG. 2 manages information indicating that the empty sectors start from the sector m1. If a read access request is made from the input/output unit 3 with respect to the flash memory 2 via the MPU 1, for example, the MPU 1 successively scans the logical addresses of each of the sectors within the flash memory array starting from the sector 00 in FIG. 3 (A). When the logical address of a sector in which the erasure managing flag is not set matches the logical address of the access destination, the data of this sector is read out and transmitted to the input/output unit 3.

On the other hand, if a rewrite access request is made from the input/output unit 3 with respect to the flash memory 2, the MPU 1 detects from the flash memory 2 a sector which has the logical address of the access destination and sets the erasure enable flag in the bits D7 and D6 of the erasure managing part 11 of this sector. The flash memory 2 may store the data "0" or "1" in the initial state. Hence, the erasure enable flag is set in the bits D7 and D6 of the erasure managing part 11 by setting "1" s if the bits D7 and D6 initially store "0" s, and by setting "0" s if the bits D7 and D6 initially store "1"s.

Thereafter, the MPU 1 recognizes from the empty sector managing part 4 the sector from which the empty sectors start. For example, the MPU 1 detects the sector m1 as the sector from which the empty sectors start, and makes access to the defective sector flag in the bits D5 and D4 in the erasure managing part 11 of the sector m1. If the defective sector flag is not set in the erasure managing part 11 of the sector m1, the MPU 1 writes the logical address of the access destination into the logical address part 10, the new data which is to be written into the data part 12, and the error detection data into the error detection data part 13 of the sector m1, and stores in the empty sector managing part 4 information indicating that the next empty sector is the sector m2.

However, if one of the bits D5 or D4 of the deflective flag is set in the erasure managing part 11 of the sector m1, the MPU 1 carries out a write operation with respect to the next sector m2, in a similar manner as described above.

Figure 4:
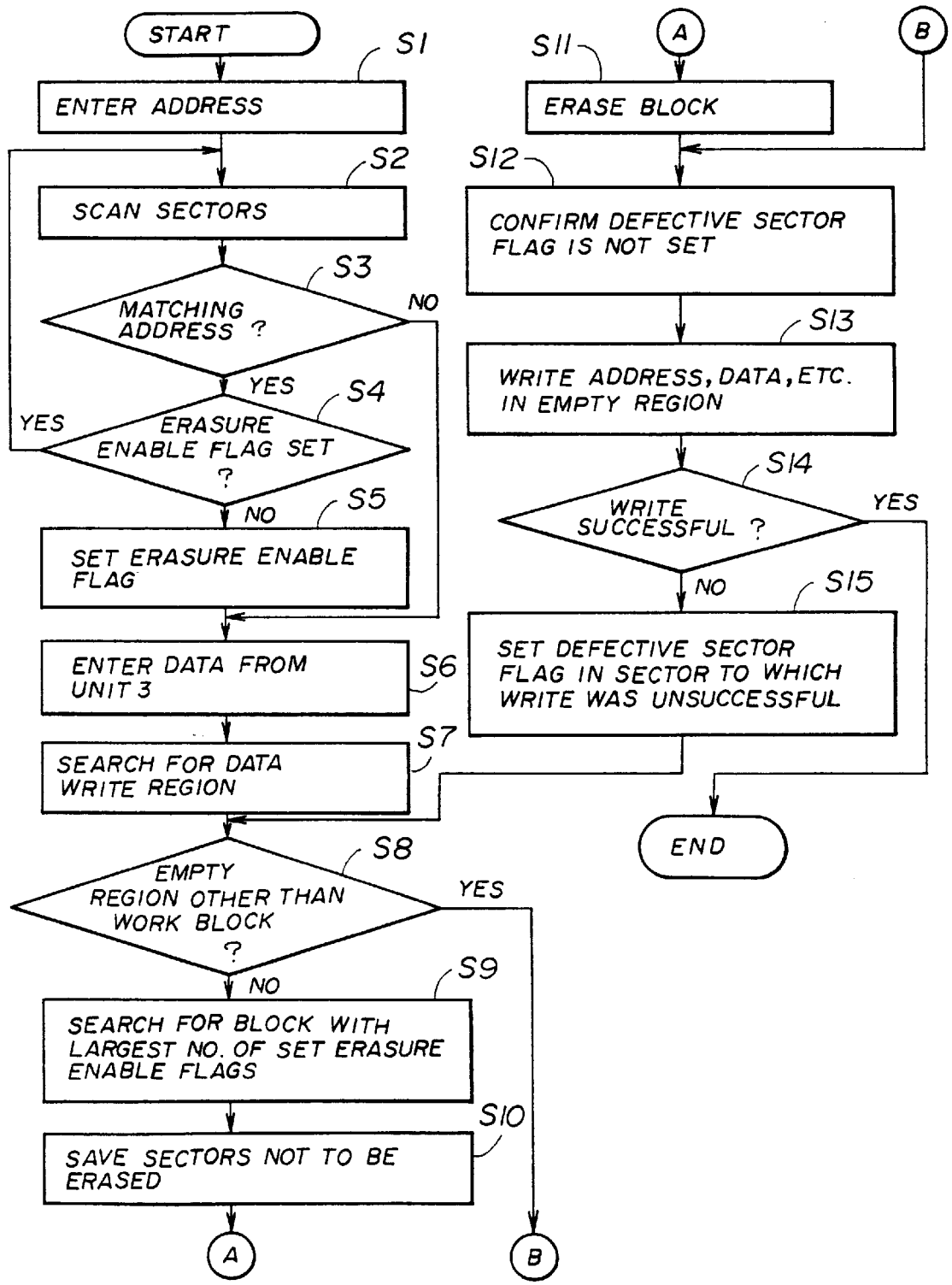
FIG. 4 is a flow chart for explaining a write process of the embodiment.

Next, a more detailed description will be given of the write operation of this embodiment, by referring to FIG. 4. FIG. 4 is a flow chart showing the write operation of the MPU 1 shown in FIG. 2.

In FIG. 4, a step S1 enters an input logical address from the input/output unit 3 shown in FIG. 2, and a step S2 scans the sectors of the flash memory 2 in which data are already written. A step S3 decides whether or not the flash memory 2 has a sector with the same logical address as the input logical address. The process advances to a step S4 if the decision result in the step S3 is YES, but advances to a step S6 if the decision result in the step S3 is NO.

The step S4 decides whether or not the sector having the same logical address as the input logical address has an erasure managing part 11 in which the erasure enable flag is set. The process returns to the step S2 if the decision result in the step S4 is YES. On the other hand, if the decision result in the step S4 is NO, a step S5 sets the erasure enable flag in the erasure managing part 11 of this sector, and the step S6 enters the data which is to be written from the input/output unit 3. Then, a step S7 searches for the region of the flash memory 2 in which the data is to be written.

In this case, the flash memory 2 has a total memory capacity amounting to m−1 blocks even though m blocks are provided, and one block is used as a work block. As described above, each block may correspond to one or more flash memory chips. Hence, out of the m blocks of the flash memory 2, only m−1 blocks are used as the effective memory region of the flash memory 2.

A step S8 decides whether or not the flash memory 2 includes an empty region other than the work block described above. The process advances to a step S9 if the decision result in the step S8 is NO, but the process advances to a step S12 if the decision result in the step S8 is YES.

The step S9 searches for a block which has the largest number of erasure enable flags which are set in the sectors of the blocks. Then, a step S10 saves those sectors which form this block found in the step S9 but in which the erasure enable flag is not set, into the work block by copying the contents of the sectors to the work block. Thereafter, a step S11 erases the block which is found in the step S9, and regards this block as a new work block.

The step S12 confirms that the defective sector flag of the sector which is located at the start of the empty region is not set, and moves to the next sector if the defective sector flag is set. A step S13 writes the address, data and error detection data into the empty region.

A step S14 decides whether or not the write operation was successful. The process ends if the decision result in the step S14 is YES. On the other hand, if the decision result in the step S14 is NO, a step S15 sets the defective sector flag of the sector with respect to which the write operation was unsuccessful, and the process returns to the step S8.

After the write operation with respect to the memory region, that is, m−1 blocks, ends, it is possible to adjust the data using the work block. For example, a block (or flash memory chip) which has the largest erasable region is detected from the blocks (or flash memory chip or chips) to which the data have already been written. Out of this block which has the largest erasable region, the region which should not be erased is saved in the work block by copying the contents thereof, and the next data which is to be written is written after these contents. In addition, the above block which has the largest erasable region is erased after the contents to be saved are copied into the work block, and the erased block is prepared for use as a new work block during the next data adjustment.

Figure 5:
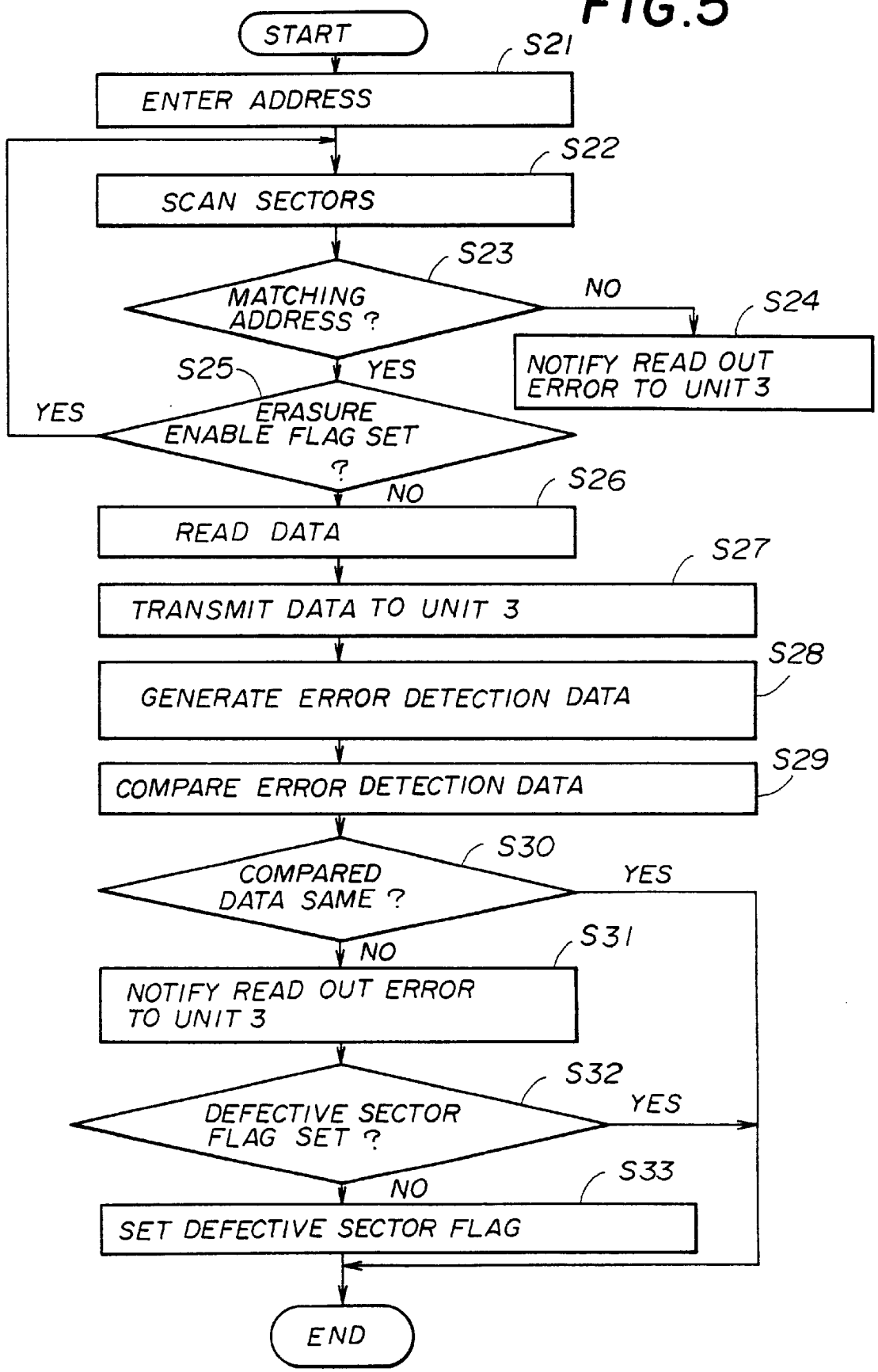
FIG. 5 is a flow chart for explaining a read process of the embodiment.

Next, a more detailed description will be given of the read operation of this embodiment. FIG. 5 is a flow chart showing the read operation of the MPU 1 shown in FIG. 2.

In FIG. 5, a step S21 ends an input logical address from the input/output unit 3 shown in FIG. 2, and a step S22 scans the sectors of the flash memory 2 in which data are already written. A step S23 decides whether or not the flash memory 2 has a sector with the same logical address as the input logical address. The process advances to a step S25 if the decision result in the step S23 is YES, but advances to a step S24 if the decision result in the step S23 is NO. The step S24 notifies an error in the read out to the input/output unit 3 via the MPU 1.

The step S25 decides whether or not the sector having the same logical address as the input logical address has an erasure managing part 11 in which the erasure enable flag is set. The process returns to the step S22 if the decision result in the step S25 is YES. On the other hand, if the decision result in the step S25 is NO, a step S26 reads the data from this sector having the same logical address as the input logical address, and a step S27 transmits the read out data to the input/output unit 3.

A step S28 generates an error detection data which is related to the read out data and indicates the error therein. A step S29 compares the error detection data which is generated in the step S28 with the error detection data read out from the error detection data part 13 of the sector. A step S30 decides whether or not the two compared error detection data match. The process ends if the decision result in the step S30 is YES, but the process advances to a step S31 if the decision result in the step S30 is NO. The step S31 notifies a read out error to the input/output unit 3 via the MPU 1.

In addition, a step S32 decides whether or not the defective sector flag in the erasure managing part 11 of the sector is set. The process ends if the decision result in the step S32 is YES. On the other hand, if the decision result in the step S32 is NO, a step S33 sets the defective sector flag in the erasure managing part 11 of the sector, and the process ends.

Further, the present invention is not limited to these embodiments, but various variations and modifications may be made without departing from the scope of the present invention.

What is claimed is:

1. A method of controlling a non-volatile memory having a plurality of blocks, said memory being erased by a minimum unit of one block, said method comprising the steps of:

(a) dividing each of the blocks of the memory into a plurality of sectors, each of said sectors including a storage portion for storing at least a logical address of the sector, and a data part for storing data; and (b) accessing a desired sector of the memory by specifying the logical address of the desired sector, comparing the specified logical address with said logical address stored in each of the sectors, and detecting a sector which has a logical address matching the specified logical address.

2. The method as claimed in claim 1, wherein the memory is made up of at least one memory chip.

3. The method as claimed in claim 1, wherein a total memory region of the memory amounts to m blocks, m−1 blocks are used as an effective memory region, and the remaining one block is used as a work block.

4. The method as claimed in claim 3, which further comprises the steps of:

(c) adjusting data in the memory using the work block after a write operation with respect to all of the m−1 blocks ends.

5. The method as claimed in claim 1, wherein said step (a) divides the memory region so that each sector further includes an error detection data part for storing information which is used for detecting and correcting an error in the data stored in the data part.

6. The method as claimed in claim 1, wherein each of said sectors further includes an erasure managing part for storing information which indicates at least whether or not the sector may be erased, and said step (a) divides a memory region of the memory so that the erasure managing part of each sector includes an erasure enable flag which has an initial state if the data part of the sector to which said erasure enable flag belongs is valid and has a state other than the initial state if the data part of the sector to which said erasure enable flag belongs is invalid.

7. The method as claimed in claim 6, wherein the erasure managing part of each sector includes a plurality of erasure enable flags.

8. The method as claimed in claim 1, wherein each of said sectors further includes an erasure managing part for storing information which indicates at least whether or not the sector may be erased, and said step (a) divides a memory region of the memory so that the erasure managing part of each sector includes a defective sector flag which indicates whether or not the sector is defective.

9. The method as claimed in claim 8, wherein the erasure managing part of each sector includes a plurality of defective sector flags.

10. The method as claimed in claim 1, wherein each of said sectors further includes an erasure managing part for storing information which indicates at least whether or not the sector may be erased, and further comprising the steps of:

(c) managing empty sectors of the memory based on the information stored in the erasure managing part of each sector.

11. A non-volatile memory device which is erased by a minimum unit of one block, comprising:

a memory having a plurality of blocks, each of said blocks being divided into a plurality of sectors each including a storage portion for storing at least a logical address of the sector, and a data part for storing data; and a control unit, coupled to said memory, accessing a desired sector of said memory by specifying a logical address of the desired sector, comparing the specified logical address with said logical address stored in each of the sectors, and detecting a sector which has a logical address matching the specified logical address.

12. The non-volatile memory device as claimed in claim 11, wherein said memory is made up of at least one memory chip.

13. The non-volatile memory device as claimed in claim 11, wherein a total memory region of said memory amounts to m blocks, m−1 blocks are used as an effective memory region, and the remaining one block forms a work block.

14. The non-volatile memory device as claimed in claim 13, wherein said control unit includes a part which adjusts data in said memory using the work block after a write operation with respect to all of the m−1 blocks ends.

15. The non-volatile memory device as claimed in claim 11, wherein each sector further includes an error detection data part for storing information which is used for detecting and correcting an error in the data stored in the data part.

16. The non-volatile memory device as claimed in claim 11, wherein each of said sectors further includes an erasure managing part for storing information which indicates at least whether or not the sector may be erased, and the erasure managing part of each sector includes an erasure enable flag which has an initial state if the data part of the sector to which said erasure enable flag belongs is valid and has a state other than the initial state if the data part of the sector to which said erasure enable flag belongs is invalid.

17. The non-volatile memory device as claimed in claim 16, wherein the erasure managing part of each sector includes a plurality of erasure enable flags.

18. The non-volatile memory device as claimed in claim 11, wherein each of said sectors further includes an erasure managing part for storing information which indicates at least whether or not the sector may be erased, and the erasure managing part of each sector includes a defective sector flag which indicates whether or not the sector is defective.

19. The non-volatile memory device as claimed in claim 18, wherein the erasure managing part of each sector includes a plurality of defective sector flags.

20. The non-volatile memory device as claimed in claim 11, wherein each of said sectors further includes an erasure managing part for storing information which indicates at least whether or not the sector may be erased, and said control unit includes a part which manages empty sectors of said memory based on the information stored in the erasure managing part of each sector.

21. A memory controller for controlling a memory device having a memory including a plurality of blocks, each of said blocks being divided into a plurality of sectors each including a storage portion for storing at least a logical address of the sector and a data part for storing data, said memory being erased by a minimum unit of one block, said memory controller comprising:

a control unit accessing a desired sector of the memory by specifying a logical address of the desired sector, comparing the specified logical address with said logical address stored in each of the sectors, and detecting a sector which has a logical address matching the specified logical address.

* * * * *